(12) United States Patent
Reingruber et al.

(10) Patent No.: US 11,715,820 B2
(45) Date of Patent: Aug. 1, 2023

(54) OPTOELECTRONIC COMPONENT AND METHOD FOR PRODUCING AN OPTOELECTRONIC COMPONENT

(71) Applicant: OSRAM OLED GmbH, Regensburg (DE)

(72) Inventors: Klaus Reingruber, Langquaid (DE); Michael Zitzlsperger, Regensburg (DE); Matthias Goldbach, Pentling (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/966,331

(22) PCT Filed: Mar. 12, 2019

(86) PCT No.: PCT/EP2019/056171
§ 371 (c)(1),
(2) Date: Jul. 30, 2020

(87) PCT Pub. No.: WO2019/175180
PCT Pub. Date: Sep. 19, 2019

(65) Prior Publication Data
US 2020/0373470 A1 Nov. 26, 2020

(30) Foreign Application Priority Data
Mar. 14, 2018 (DE) .......................... 102018105908.6

(51) Int. Cl.
*H01L 33/60* (2010.01)
*H01L 33/54* (2010.01)
(Continued)

(52) U.S. Cl.
CPC .............. *H01L 33/60* (2013.01); *H01L 33/54* (2013.01); *H01S 5/0234* (2021.01);
(Continued)

(58) Field of Classification Search
CPC ..... H01S 5/02216; H01L 33/44; H01L 33/46; H01L 33/60; H01L 33/54; H01L 33/50;
(Continued)

(56) References Cited

U.S. PATENT DOCUMENTS

| 2003/0201451 A1 | 10/2003 | Suehiro et al. |
| 2011/0062469 A1 | 3/2011 | Camras et al. |
| 2017/0256674 A1 * | 9/2017 | Hashimoto ............. H01L 33/08 |

FOREIGN PATENT DOCUMENTS

| DE | 102009036621 A1 | 2/2011 |
| DE | 102014108282 A1 | 12/2015 |
| EP | 3174110 A1 | 5/2017 |

OTHER PUBLICATIONS

International Search Report and Written Opinion issued in International Application No. PCT/EP2019/056171 dated Apr. 25, 2019.

* cited by examiner

*Primary Examiner* — Antonio B Crite
(74) *Attorney, Agent, or Firm* — ArentFox Schiff LLP

(57) ABSTRACT

In at least one embodiment, the optoelectronic component comprises an optoelectronic semiconductor chip with an emission side and a rear side opposite the emission side. Furthermore, the component comprises a housing body with a top side and an underside opposite the top side, and a metal layer on the top side of the housing body. During proper operation, the semiconductor chip emits primary electromagnetic radiation via the emission side. The semiconductor chip is embedded in the housing body and laterally surrounded by the housing body. The emission side is on the rear side and the top side is downstream of the underside along a main emission direction of the semiconductor chip. The metal layer is at least partially reflecting or absorbing radiation generated by the optoelectronic component.

15 Claims, 4 Drawing Sheets

Figure 1:
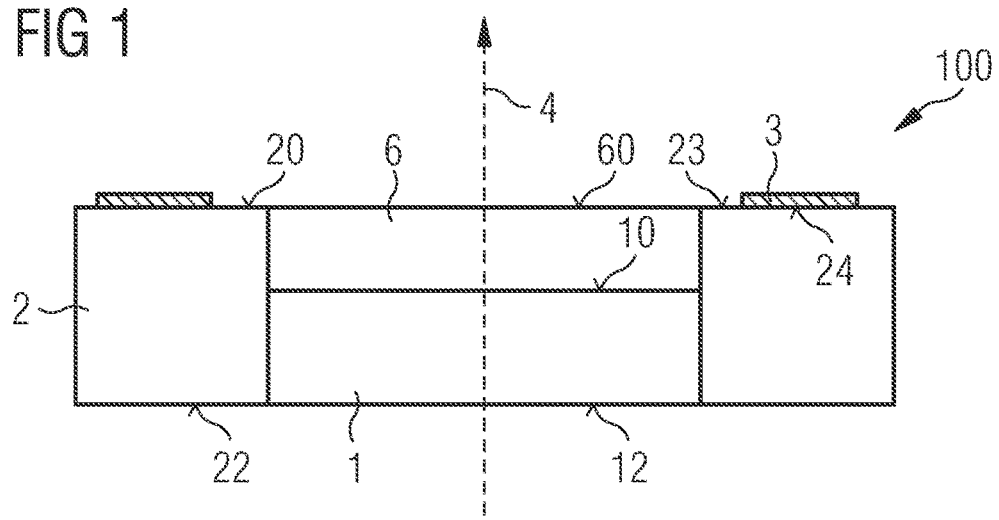

(51) Int. Cl.
*H01L 33/44* (2010.01)
*H01L 33/46* (2010.01)
*H01L 33/48* (2010.01)
*H01S 5/02216* (2021.01)
*H01S 5/0234* (2021.01)
*H01S 5/30* (2006.01)
*H01L 33/50* (2010.01)

(52) U.S. Cl.
CPC .......... *H01S 5/02216* (2013.01); *H01L 33/50* (2013.01); *H01L 2933/005* (2013.01); *H01L 2933/0041* (2013.01); *H01L 2933/0058* (2013.01); *H01S 5/3013* (2013.01)

(58) Field of Classification Search
CPC ... H01L 33/501; H01L 33/502; H01L 33/503; H01L 2933/0041
See application file for complete search history.

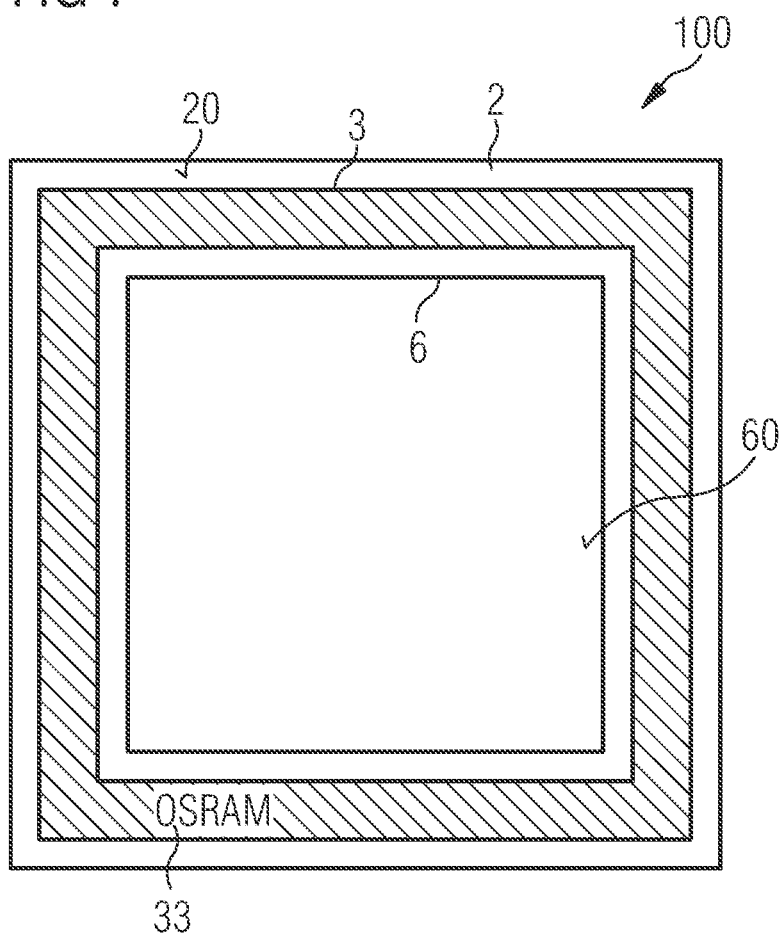

OPTOELECTRONIC COMPONENT AND METHOD FOR PRODUCING AN OPTOELECTRONIC COMPONENT

This application is a 35 U.S.C. § 371 National Phase of PCT Application No. PCT/EP2019/056171, filed Mar. 12, 2019, which claims priority to German Application No. 102018105908.6, filed Mar. 14, 2018, the disclosures of which are hereby incorporated by reference herein in their entireties.

An optoelectronic component is specified. In addition, a method for producing an optoelectronic component is specified.

One task to be solved is to provide an optoelectronic component with a high contrast ratio. A further task to be solved is to specify a method for producing such an optoelectronic component.

These tasks are solved inter alia by the subject-matter of the independent claims. Advantageous designs and further embodiments are subject of the dependent patent claims.

According to at least one embodiment, the optoelectronic component comprises an optoelectronic semiconductor chip with an emission side and a rear side opposite the emission side. The emission side and the rear side preferably run essentially parallel to each other. For example, the emission side and the rear side form main sides of the semiconductor chip which extend substantially parallel to a main plane of extension of the semiconductor chip.

The rear side of the semiconductor chip can be a contact side. For example, all contact elements required for electrical contacting of the semiconductor chip are arranged on the rear side. Alternatively, however, it is also possible that contact elements for the electrical contacting of the semiconductor chip are arranged both on the rear side and on the emission side.

The optoelectronic semiconductor chip comprises a semiconductor layer sequence with an active layer for generating electromagnetic radiation. The semiconductor layer sequence is based, for example, on a III-V compound semiconductor material. The semiconductor material is for example a nitride compound semiconductor material, such as $Al_nIn_{1-n-m}Ga_mN$, or a phosphide compound semiconductor material, such as $Al_nIn_{1-n-m}Ga_mP$, or an arsenide compound semiconductor material, such as $Al_nIn_{1-n-m}Ga_mAs$ or $Al_nIn_{1-n-m}Ga_mAsP$, whereas in each case $0 \leq n \leq 1$, $0 \leq m \leq 1$ and $m+n \leq 1$. The semiconductor layer sequence may contain dopants and additional components. For the sake of simplicity, however, only the essential constituents of the crystal lattice of the semiconductor layer sequence, i.e. Al, As, Ga, In, N or P, are given, even if these may be partially replaced and/or supplemented by small amounts of other substances. Preferably the semiconductor layer sequence is based on AlInGaN.

The active layer of the semiconductor layer sequence contains in particular at least one pn junction and/or at least one quantum well structure and can, for example, generate primary electromagnetic radiation in the blue or green or red spectral range or in the UV range when operated as intended. Preferably, the semiconductor chip comprises one, in particular exactly one, continuous, in particular simply connected, active layer. Alternatively, the active layer can also be segmented.

Here and in the following a semiconductor chip is understood to be an element that can be handled separately and can be contacted electrically. A semiconductor chip is created by separation from a wafer compound. In particular, side surfaces of such a semiconductor chip running transverse to the emission side show traces from the separation process of the wafer compound. A semiconductor chip comprises exactly one originally connected region of the semiconductor layer sequence grown in the wafer compound. The semiconductor layer sequence of the semiconductor chip is preferably formed coherently. The lateral extension of the semiconductor chip, measured parallel to the main extension plane of the active layer, is for example at most 1% or at most 5% larger than the lateral extension of the active layer or the semiconductor layer sequence. The semiconductor chip also includes the growth substrate on which the semiconductor layer sequence has grown.

The semiconductor chip can be a so-called volume emitter, in particular a flip chip. In this case, the semiconductor chip preferably also includes the growth substrate, which is formed from sapphire, for example. Alternatively, the semiconductor chip can also be a surface emitter, especially a so-called thin-film chip. In this case, the growth substrate is detached, for example.

According to at least one embodiment, the optoelectronic component comprises a housing body with a top side and an underside opposite the top side. The housing body is preferably made of a material that is reflective or absorbent for the radiation generated by the component. For example, the housing body may comprise an organic matrix material such as silicone or epoxy, or a hybrid of silicone and epoxy.

Radiation reflecting particles, such as $TiO_2$ particles, may be embedded in the matrix material. For example, the housing body may appear white to a user. In particular, the housing body is an injection-molded body or molded body.

For example, the underside of the housing body runs essentially parallel to a main plane of the component. The top side of the housing body can be essentially parallel to the underside in sections or everywhere.

The housing body is preferably formed in one piece. This means that all regions of the housing body are formed integrally with each other and contain or consist of the same material. In particular, the housing body is a coherent, preferably simply connected, body.

According to at least one embodiment, a metal layer is applied to the top side of the housing body. For example, the metal layer is applied to the top side by means of a deposition process such as evaporation or sputtering or electrophoresis. For example, the thickness of the metal layer, measured perpendicular to the top side of the housing body, is 50 μm or 40 μm or 30 μm at the most. Alternatively or additionally, the thickness of the metal layer may be at least 0.5 μm or at least 1 μm or at least 5 μm. Here and in the following, a thickness is understood to mean in particular the average or maximum thickness.

For example, the metal layer is a continuous and/or one-pieced layer. The metal layer preferably consists entirely of metal. The metal layer can be applied directly to the top side of the housing body, i.e. it can be in direct contact with the housing body. Alternatively, an adhesion promoter layer can also be applied between the housing body and the metal layer. The metal layer preferably forms the top side in a form-fit or conformal manner. For example, a distance between the metal layer and the top side is at most 10 μm or at most 5 μm.

According to at least one embodiment, the semiconductor chip emits primary electromagnetic radiation via the emission side during normal operation. For example, during operation at least 50% or at least 75% or at least 90% of the primary radiation coupled out of the semiconductor chip is coupled out via the emission side. For example, not more than 10% or not more than 5% or not more than 1% of the primary radiation coupled out of the semiconductor chip is coupled out via the rear side.

The optoelectronic component is in particular an LED or a laser diode.

According to at least one embodiment, the semiconductor chip is embedded in the housing body and laterally surrounded by the housing body. A lateral direction is a direction parallel to a main extension plane of the component or the semiconductor chip. The housing body can completely surround the semiconductor chip laterally. A continuous track or frame is then formed around the semiconductor chip from the housing body. The width of the housing body, measured in the lateral direction, is at least 50 µm or at least 100 µm or at least 500 µm all around the semiconductor chip, for example.

"Embedded" in this case means that the semiconductor chip is laterally wrapped with the housing body, for example because the housing body has been positioned around the semiconductor chip using an injection molding process. In particular, the housing body forms the semiconductor chip in a form-fit or conformal manner in the lateral direction.

The housing body can be directly adjacent to the semiconductor chip. The semiconductor chip comprises lateral surfaces that are transverse or perpendicular to the emission side. For example, the housing body is adjacent to these side surfaces. The side surfaces of the semiconductor chip are, for example, at least 75% or completely covered by the housing body.

Preferably, the emission side is free of the housing body. In a top view of the emission side, the housing body does not cover any region of the emission side or at least not the entire emission side. In particular, in a top view of the emission side, the metal layer does not cover any region of the emission side or at least not the entire emission side.

According to at least one embodiment, the emission side is arranged downstream of the rear side along a main emission direction of the semiconductor chip. Furthermore, the top side of the housing body is arranged downstream of the underside of the housing body along the main emission direction. The main emission direction is in particular a direction perpendicular to the emission side or perpendicular to the lateral direction. The top side of the housing body and the underside of the housing body are thus arranged along the main emission direction in the same order as the emission side and the rear side.

According to at least one embodiment, the metal layer is at least partially reflecting or absorbing radiation generated by the optoelectronic component. For example, the metal layer has a transmittance for the radiation generated by the component of not more than 10% or not more than 5% or not more than 1%. The transmittance is specified for the wavelength at which the radiation generated by the component has a maximum intensity.

The radiation generated by the component may be the primary radiation of the semiconductor chip. Preferably, however, the component includes a conversion element which partially or completely converts the primary radiation. The radiation generated by the component is then the resulting radiation.

According to at least one embodiment, the optoelectronic component comprises an optoelectronic semiconductor chip with an emission side and a rear side opposite the emission side. Furthermore, the component comprises a housing body with a top side and an underside opposite the top side, and a metal layer on the top side of the housing body. When operating as intended, the semiconductor chip emits primary electromagnetic radiation via the emission side. The semiconductor chip is embedded in the housing body and laterally surrounded by the housing body. The emission side is on the rear side and the top side is downstream of the underside along a main emission direction of the semiconductor chip. The metal layer is at least partially reflecting or absorbing radiation generated by the optoelectronic component.

The present invention is based in particular on the realization that for many applications, for example in the automotive sector, especially in headlights, optoelectronic components with a high contrast ratio between the light-emitting surface and the surrounding housing body are required. As a rule, this high contrast ratio cannot be achieved by the housing body alone because the penetration depth of the radiation into the housing material is too deep. This is particularly the case with housing bodies that are manufactured using an injection molding process. A luminous border is then created in the housing body around the actual radiation-emitting emission side.

To prevent emission in the region of the housing body, a metal layer is applied to the top side of the housing body, which is reflective or absorbent. Metal layers can be created by very precise methods such as sputtering or vaporization using a mask. This allows the metal layer to be formed very close to the semiconductor chip. This allows the luminous border around the emission side to be reduced.

The optoelectronic component specified here can be a so-called chip-scale package. In this case, for example, an entire underside of the component is at most 50% or at most 20% larger than the rear side of the semiconductor chip.

The housing body preferably also has side surfaces that are transverse or perpendicular to the top side or the underside. The side surfaces may show traces of a separation process. The side surfaces themselves are preferably covered by the metal layer at most. The regions of the side surfaces of the housing body that show traces of a separation process are preferably not covered by any material. These side surfaces form, for example, lateral outer surfaces of the component.

According to at least one embodiment, the metal layer is offset in the lateral direction by at most 200 µm or at most 150 µm or at most 100 µm or at most 50 µm or at most 20 µm with respect to the emission side. Preferably, the metal layer all around the semiconductor chip has such a maximum lateral offset with respect to the emission side. If the metal layer is projected onto the plane encompassing the emission side, the distance of the projected metal layer to the emission side is at most the above-mentioned offset. Preferably, however, the metal layer is laterally offset by at least 100 nm or at least 1 µm with respect to the emission side.

According to at least one embodiment, the semiconductor chip is completely surrounded laterally by the metal layer in top view of the emission side. In a top view of the emission side, a continuous path or frame of the metal layer completely surrounds the semiconductor chip.

According to at least one embodiment, the metal layer is reflective for the radiation generated by the optoelectronic component or has a reflective partial layer facing the top side. For example, the metal layer or the partial layer of the metal layer comprises or consists of Ag or Al or Ti. For example, the reflectance of the metal layer or partial layer is at least 80% or at least 90% or at least 95%. Data relating to the reflectance of the metal layer or the partial layer of the metal layer refer as above to the wavelength at which the radiation generated by the component has an intensity maximum.

According to at least one embodiment, a non-metallic coating is applied to a side of the metal layer facing away from the top side of the housing body. The non-metallic coating may appear black or white to the user. The non-metallic coating can increase the optical effect of the metal layer, such as the reflectivity.

According to at least one embodiment, at least a first section of the top side of the housing body, in particular the entire top side of the housing body, is located downstream of the emission side in the main emission direction or is at the same level as the emission side. The first section is preferably offset in the lateral direction by at most 50 μm or at most 10 μm with respect to the emission side. This already prevents primary radiation from exiting laterally from the component.

The first section is a continuous, especially simply connected region of the top side. The first section, when viewed from above on the emission side, for example, runs laterally completely around the semiconductor chip. This means that the first section forms a path around the semiconductor chip when the top side is viewed from above, whereby the width of the path is preferably constant within the manufacturing tolerance.

The share of the first section in the total area of the top side is, for example, at least 5% or at least 10%. Alternatively or additionally, the first section may represent at most 30% or at most 20% of the total area of the top side. For example, in the first section, the top side of the housing body is substantially flat or flat and/or parallel to the emission side of the semiconductor chip.

The first section of the top side of the housing body may be partially or completely covered with the metal layer. The first section can also be free of the metal layer.

According to at least one embodiment, the metal layer protrudes beyond the emission side in the main emission direction by not more than 350 μm or not more than 300 μm or not more than 250 μm or not more than 200 μm or not more than 150 μm or not more than 100 μm. This means that one side of the metal layer facing away from the top side is offset with respect to the emission side in the main emission direction by at most this amount. This maximum offset prevents the light from being focused too strongly along the main emission direction.

According to at least one embodiment, a conversion element is arranged on the emission side of the semiconductor chip, which comprises an exit side facing away from the semiconductor chip. In particular, the conversion element is designed to convert some or all of the primary radiation emitted by the semiconductor chip into radiation of a different wavelength range. The converted radiation or the mixture of converted radiation and primary radiation leaves the conversion element via the exit side. This radiation or this mixture of radiation is preferably light in the visible spectral range.

The conversion element preferably covers at least 50% or at least 75% of the emission side of the semiconductor chip. For example, a thickness of the conversion element, measured perpendicular to the emission side, is at most 200 μm or at most 150 μm or at most 100 μm. Alternatively or additionally, the thickness of the conversion element may be at least 5 μm or at least 10 μm or at least 20 μm.

The conversion element comprises for example a matrix material, such as silicone or siloxane or silazane, with embedded phosphor particles.

According to at least one embodiment, the first section of the top side is offset along the main emission direction by at most 100 μm or at most 50 μm or at most 25 μm or at most 10 μm or at most 5 μm with respect to the exit side of the conversion element. This means in particular that the first section of the top side can project beyond the exit side of the conversion element in the main emission direction by at most the amount mentioned. Preferably, the first section of the top side of the housing body is flush with the exit side of the conversion element. This prevents light from exiting sideways from the conversion element. On the other hand, the housing body does not project beyond the conversion element to such an extent that the emitted radiation is focused too strongly.

According to at least one embodiment, the top side of the housing body comprises at least one second section in which the top side of the housing body runs essentially parallel to the emission side of the semiconductor chip. For example, the second section occupies an area of at least 10% or at least 25% or at least 50% of the total area of the top side. The second section is a continuous, in particular simply connected, section of the top side which, when viewed from above, runs, for example, laterally completely around the semiconductor chip.

According to at least one embodiment, the metal layer covers the top side at least in the second section. In particular, the second section is completely covered by the metal layer.

According to at least one embodiment, the top side of the housing body is flat or even within the manufacturing tolerance. The top side can run essentially parallel to the emission side. "Essentially parallel" means that two surfaces run parallel within the manufacturing tolerance.

According to at least one embodiment, the top side comprises a third section which runs transversely or perpendicularly to the emission side. For example, the third section includes an angle of at least 30° or at least 60° with the emission side.

The third section preferably again forms a continuous, in particular simply connected region of the top side. The third section can also run laterally completely around the semiconductor chip when viewed from above. For example, the third section occupies an area of at least 10% or at least 25% or at least 50% of the total area of the top side.

The third section can extend over, for example, at least 30% or at least 50% or at least 75% of the total thickness of the housing body. In particular, the third section may lie between the first section and the second section and may be connected to the first and/or second section by an edge. The total thickness of the housing body is the maximum distance between the top side and the underside.

For example, the thickness of the housing body in the region of the third section may be at most 70% or at most 50% or at most 25% of the thickness of the housing body in the first section.

According to at least one embodiment, the third section is covered with the metal layer, in particular completely covered.

According to at least one embodiment, the third section is connected to the second section by an edge. The edge can run laterally around the semiconductor chip when viewed from above.

The metal layer can form the edge between the second section and the third section in a form-fit manner. An edge between the first section and the third section can also be overmolded by the metal layer in a form-fit manner.

According to at least one embodiment, the second section is located downstream of the third section along a lateral direction away from the semiconductor chip. Measured along the lateral direction, the second section is thus located further away from the semiconductor chip than the third section.

According to at least one embodiment, the top side of the housing body is provided with a trench. The trench is preferably V-shaped.

According to at least one embodiment, the top side of the housing body is covered with the metal layer in the region of the trench. Preferably, the metal layer forms the top side of the housing body in the region of the trench in a form-fit manner.

The trench can, for example, have a depth of at least 25% or at least 30% of the total thickness of the housing body.

Alternatively or additionally, the depth of the trench may be at most 60% or at most 50% of the total thickness of the housing body.

According to at least one embodiment, the metal layer has an identifying feature incorporated into it that can be read by the naked eye or a camera. The identifying feature can be, for example, a QR code or a DMC code or an inscription.

In addition, a method for producing an optoelectronic component is specified. The method is particularly suitable for producing one or more optoelectronic components as described above. This means that all features disclosed in connection with the optoelectronic component are also disclosed for the method and vice versa.

According to at least one embodiment, the method comprises a step A), in which an optoelectronic semiconductor chip is provided, which is embedded in a housing body and laterally surrounded by the housing body. The semiconductor chip comprises an emission side and a rear side opposite the emission side. In normal operation, the semiconductor chip emits primary electromagnetic radiation via the emission side. The housing body comprises a top side and an underside opposite the top side. The emission side is arranged downstream of the rear side along a main emission direction of the semiconductor chip. Furthermore, the top side is arranged downstream of the underside along the main emission direction.

According to at least one embodiment, the method comprises a step B) in which a metal layer is deposited on the top side of the housing body. The metal layer is applied by using a mask.

The mask is used to define the shape of the metal layer on the top side of the housing body. For example, a mask can be formed from a photoresist layer. The photoresist layer can be patterned by a photolithographic step or by laser exposure to define the shape of the mask. Especially with laser exposure, individually adapted masks are possible. In addition, these masks can have particularly precise structures. For example, customer-specific markings or identifying features can be incorporated into the mask, which are then transferred to the metal layer.

For the deposition of the metal layer, for example, physical vapour deposition, such as sputtering or evaporation, can be used. Here it is possible to first deposit a thin partial layer of the metal layer using a physical vapour deposition process. Then the mask can be removed. The thin partial layer with the shape of the metal layer to be produced then remains on the top side of the housing body. Using an electrophoresis process, additional metal can then be deposited on the thin partial layer, bringing the metal layer to its target thickness and finishing it.

According to at least one embodiment, an identifying feature is generated in the metal layer with the aid of the mask, whereby the identifying feature can be read by the naked eye or a camera. This means that when the metal layer is deposited, the identifying feature is generated in the metal layer due to the shape of the mask. In other words, the mask is already structured with the identifying feature or the negative of the identifying feature.

According to at least one embodiment, an identifying feature is written into the metal layer after deposition of the metal layer. This is preferably done after the mask has been removed. The identifying feature can be written into the metal layer by means of a laser, for example.

According to at least one embodiment, the top side of the housing body comprises an edge or a trench. For example, the housing body around the semiconductor chip is manufactured by means of an injection molding process. Due to the shape of the injection molding tool, the top side of the housing body can be created with an edge or trench.

According to at least one embodiment, in step B) the metal layer is deposited in the region of the edge or trench. The metal layer is preferably deposited in such a way that the metal layer forms the edge or trench in a form-fit manner.

According to at least one embodiment, a compound of several semiconductor chips, each with an emission side, is provided in step A). The semiconductor chips can all be designed like the semiconductor chip described above. The semiconductor chips are preferably all embedded in the housing body. The housing body can hold the compound of semiconductor chips together. The preferred arrangement for each semiconductor chip in the compound is that the emission side of the rear side and the top side of the housing body are arranged downstream of the underside of the housing body along a main emission direction of the respective semiconductor chip.

In step B), a metal layer is then preferably applied to the top side in such a way that, when the emission side is viewed from above, each semiconductor chip is surrounded by a frame, in particular a continuous frame, of the metal layer.

According to at least one embodiment, the optoelectronic components are separated in step C). Preferably, the compound is cut through the housing body. Separation lines or saw lines or cutting lines then run through the housing body.

Step C) is preferably carried out after step B), so that in step C) the compound is separated into a plurality of optoelectronic components described above, each with an optoelectronic semiconductor chip, a housing body and a metal layer.

In the following, an optoelectronic component described here and a method described here for the production of an optoelectronic component is explained in more detail with reference to drawings using exemplary embodiments. Identical reference signs indicate identical elements in the individual figures. However, no true-to-scale references are shown; instead, individual elements may be shown in exaggerated sizes for better understanding.

Showing in:

FIGS. 1 to 6 exemplary embodiments of the optoelectronic component in cross-sectional view, FIG. 7 an exemplary embodiment of the optoelectronic component in top view, FIGS. 8A to 8D positions in an exemplary embodiment of the method for producing an optoelectronic component.

FIG. 1 shows a first exemplary embodiment of the optoelectronic component 100 in cross-sectional view. The component 100 comprises a semiconductor chip 1, for example a GaN-based flip chip or thin-film chip, which emits primary radiation during operation via an emission side 10. The primary radiation is for example blue light or UV radiation.

A rear side 12 of the semiconductor chip 1 opposite the emission side 10 comprises, for example, contact points or contact elements for electrical contacting of the semiconductor chip 1 (not shown). Both the emission side 10 and the rear side 12 extend essentially parallel to a main plane of the semiconductor chip 1. A main emission direction 4 of the semiconductor chip 1 runs perpendicular to the emission side 10 or to the main plane of the semiconductor chip 1 respectively. The emission side 10 is arranged downstream of the rear side 12 along the main emission direction 4.

A conversion element 6 is arranged on the emission side 10 of the semiconductor chip 1. The conversion element 6 comprises, for example, a matrix material, such as siloxane or silicone, with embedded fluorescent particles. The conversion element 6 is designed to convert at least part of the primary radiation emitted by the semiconductor chip 1 via the emission side 10. The converted radiation then exits the conversion element 6 via an exit side 60 of the conversion element 6 facing away from the emission side 10.

In a lateral direction, perpendicular to the main emission direction 4, the semiconductor chip 1 is surrounded by and embedded in a housing body 2. The housing body 2, for example, is based on an organic material, such as silicone or epoxy, and contains embedded radiation-reflecting particles, such as $TiO_2$ particles.

The housing body 2 in this case completely surrounds both the semiconductor chip 1 and the conversion element 6 laterally and lies against the side surfaces of the semiconductor chip 1 and the conversion element 6 in a form-fit manner. In particular, the side surfaces of the housing body 2 are in direct contact with the semiconductor chip 1 and conversion element 6.

The housing body 2 comprises a top side 20 and an underside 22. The top side 20 is arranged downstream the underside 22 along the main emission direction 4. The top side 20 has a first section 23 and a second section 24. The first section 23 is the region of the top side 20 closest to the semiconductor chip in lateral direction. The second section 24 is covered with a metal layer 3. The first section 23 is free of the metal layer 3. The first section 23 and the second section 24 are located downstream of the emission side 10 along the main emission direction 4.

The first section 23 and the second section 24 are even or flat within the manufacturing tolerance and run parallel to the emission side 10. Furthermore, the first section 23 is flush with the exit side 60 of the conversion element 6.

Unlike in this and the following exemplary embodiments, the first section 23 can also be completely covered with the metal layer 3.

The metal layer 3, for example, has a thickness between 0.5 µm and 50 µm inclusive. Measured along the lateral direction, the metal layer 3 is, for example, offset by a maximum of 50 µm with respect to the emission side 10.

Metal layer 3 is arranged to be at least partially reflecting or absorbing a radiation generated by the optoelectronic component 100. The radiation generated by component 100 is, for example, a mixture of the primary radiation of the semiconductor chip 1 and the radiation converted by the conversion element 6.

If radiation from the conversion element 6 or the semiconductor chip 1 enters the side of the housing body 2 during operation of the component 100, the metal layer 3 prevents or reduces this radiation from exiting via the top side 20 of the housing body 2. This increases the contrast between the exit side 60 of the conversion element 6 and the laterally surrounding housing body 2.

Figure 2:
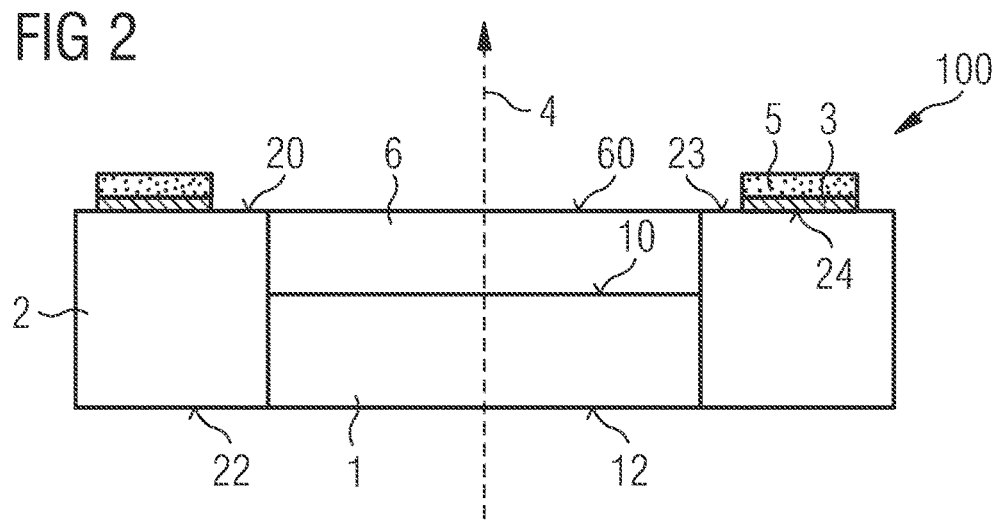

FIG. 2 shows a second exemplary embodiment of the optoelectronic component 100. A non-metallic coating 5 is applied to one side of the metal layer 3 facing away from the top side 20. The non-metallic coating can appear black or white, for example, and can enhance the reflective properties of the metal layer 3.

Figure 3:
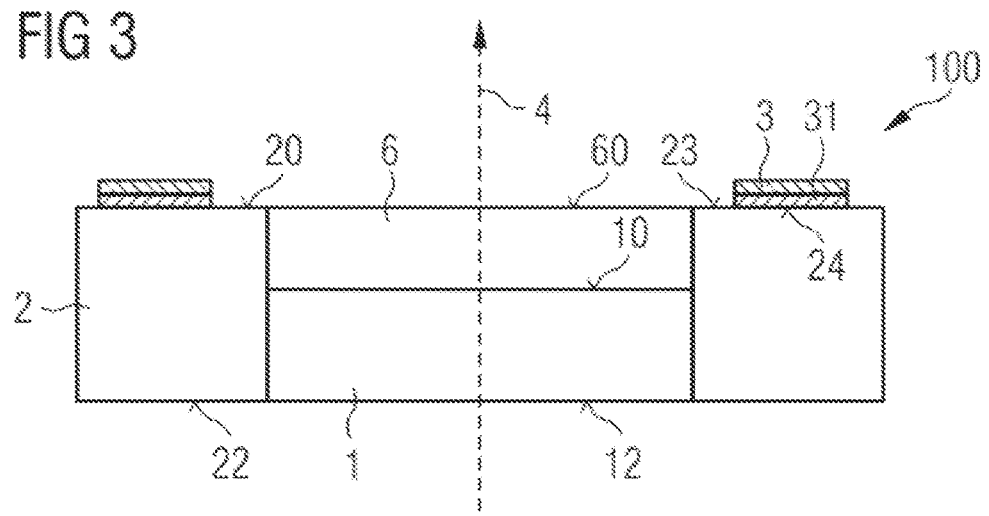

In the third exemplary embodiment in FIG. 3, the metal layer 3 comprises a partial layer 31 facing the top side 20, which is reflective to the radiation generated by the component 100. For example, the partial layer 31 consists of Ag or Ti/Ag. Alternatively, the entire metal layer 3 can also be reflective and/or comprise or consist of one of the aforementioned materials.

Figure 4:
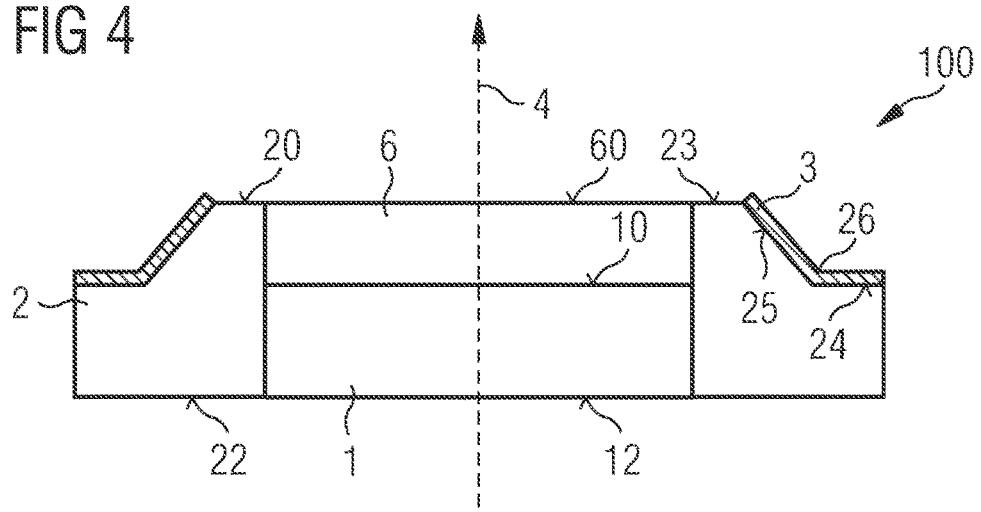

FIG. 4 shows a fourth exemplary embodiment of the optoelectronic component 100. Here, the top side 20 of the housing body 2 comprises a first section 23, a second section 24 and a third section 25. The first section 23 and the second section 24 run essentially parallel to the emission side 10. The third section 25 is located between the first section 23 and the second section 24 and runs transverse to the emission side 10. The second section 24 is connected to the third section 25 by an edge 26. Especially in the second section 24 and in the third section 25, the top side 20 of the housing body 2 is coated with the metal layer 3. The metal layer 3 forms the top side 20 in these sections 24, 25 and in the region of the edge 26 in a form-fit manner.

Figure 5:
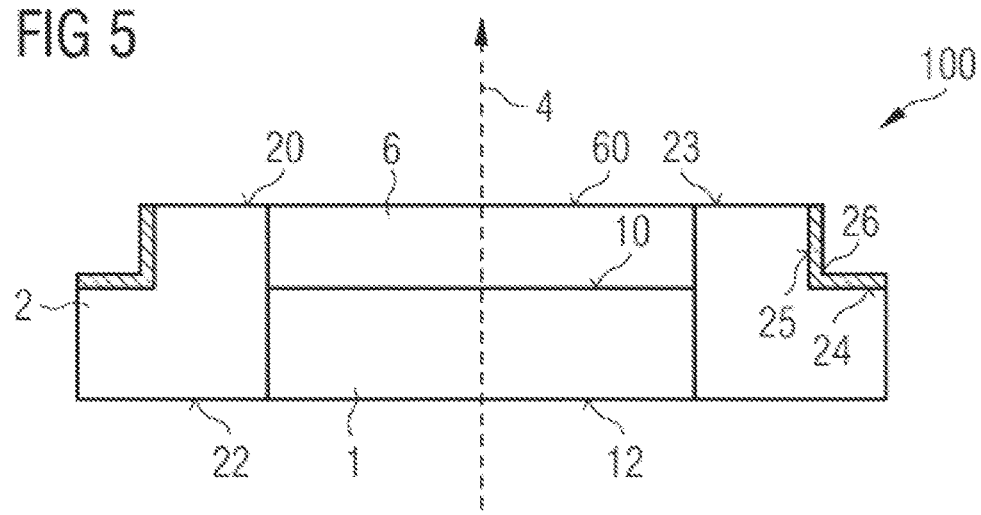

In the fifth exemplary embodiment in FIG. 5, in contrast to the fourth exemplary embodiment, the third section 25 does not run transversely but perpendicular to the emission side 10.

Figure 6:
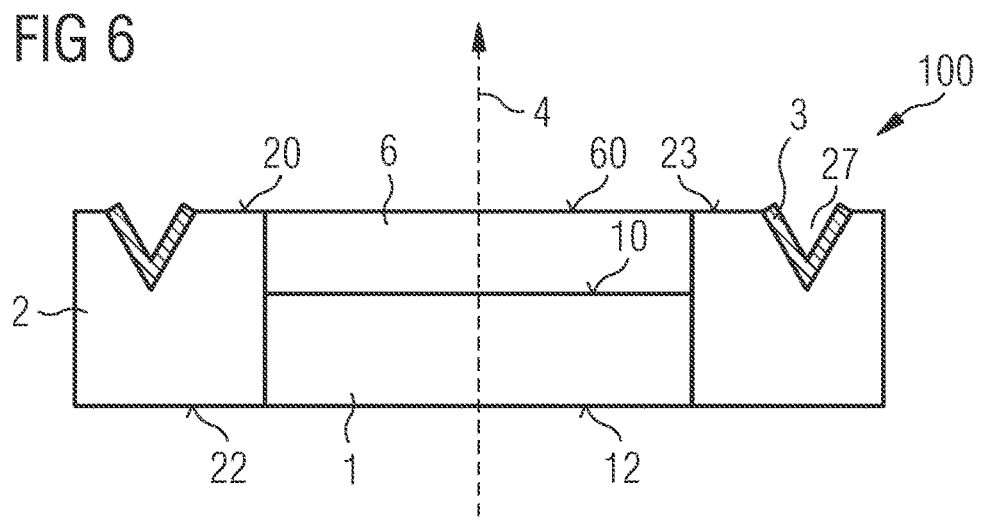

In the exemplary embodiment in FIG. 6, the top side 20 of the housing body 2 comprises a V-shaped trench 27. The trench has a depth of at least 30% of the total thickness of the housing body 2. The metal layer 3 is applied in the region of the trench 27, especially on the side walls of the trench 27, and forms the trench 27 in a form-fit manner.

FIG. 7 shows a top view of an exemplary embodiment of the optoelectronic component 100. It can be seen that the semiconductor chip 1 or the conversion element 6 is completely surrounded laterally by the housing body 2. In addition, the metal layer 3 on the top side 20 of the housing body 2 forms a continuous path that completely surrounds the semiconductor chip 1 laterally.

Furthermore, it can be seen in FIG. 7 that an identifying feature 33, in this case an inscription, is introduced into the metal layer 3. This inscription can, for example, be introduced into the metal layer 3 by means of a laser subsequently or during the application of the metal layer 3. As an alternative to an inscription, a QR code for example would also be conceivable as identifying feature 33.

Figure 8A:
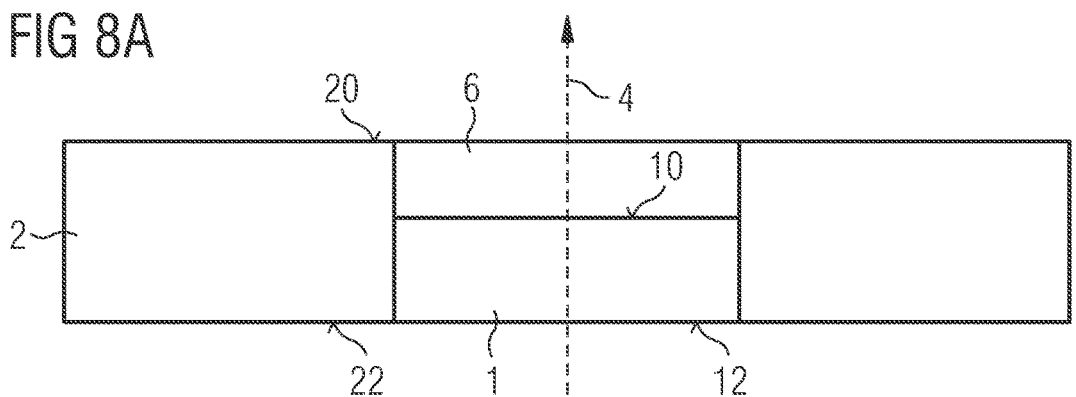

FIG. 8A shows a first position in an exemplary embodiment of the method for producing the optoelectronic component 100. A semiconductor chip 1 with a conversion element 6 arranged on it is provided. A housing body 2 is arranged laterally around the semiconductor chip 1. The object shown can be a region of a compound of several semiconductor chips 1, which are connected to each other by the housing body 2.

Figure 8B:
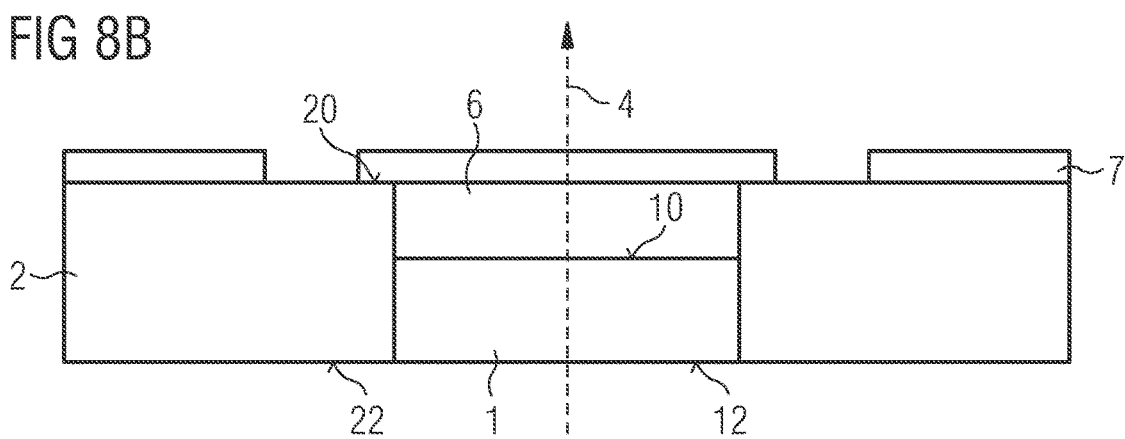

FIG. 8B shows a second position of the method in which a mask 7 is applied to the top side 20 of the housing body 2. The mask 7 can be formed from a photoresist layer, for example. The photoresist layer may have been patterned using a photolithography process or laser exposure. Mask 7 has holes in the regions where the metal layer 3 is to be applied to the top side 20.

Figure 8C:
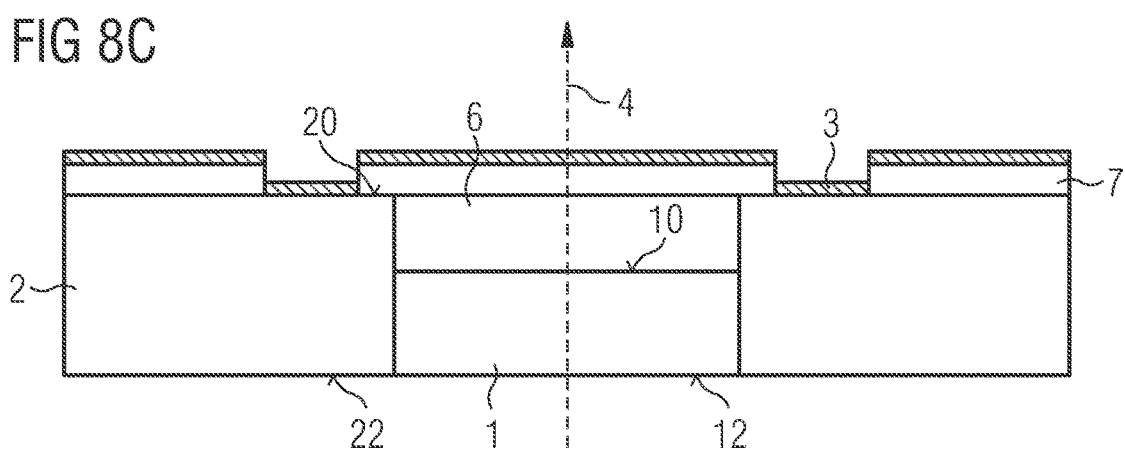

FIG. 8C shows a third position of the method where a metal layer 3 is deposited in the holes of mask 7 and on top of the mask 7. For example, a physical vapor deposition was used for this. In this position, the metal layer 3 may already have been deposited directly with its target thickness. Alternatively, it is also conceivable to first deposit the metal layer 3 as a thin partial layer.

Figure 8D:
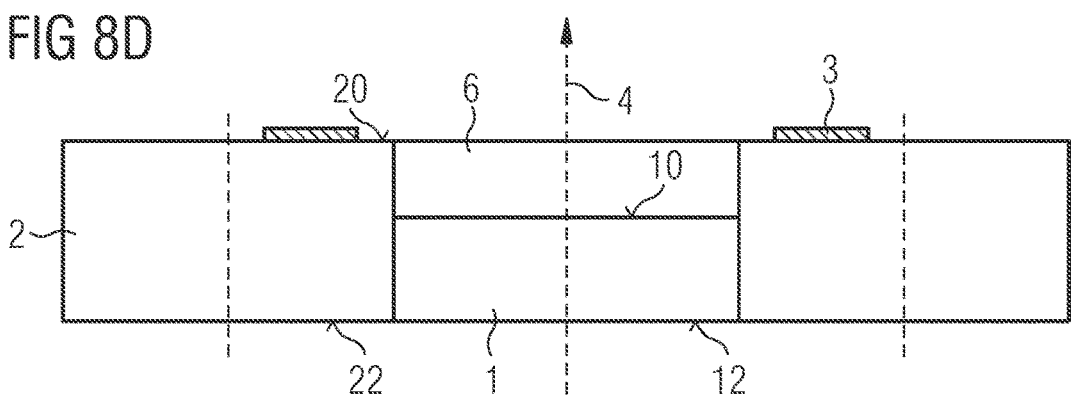

In the fourth position of FIG. 8D, mask 7 is detached, leaving the metal layer 3 on the top side 20. If the metal layer 3 was only deposited as a thin partial layer during deposition, an electrophoresis process can now be carried out in a subsequent step to bring the metal layer 3 to its target thickness.

Furthermore, FIG. 8D with the dotted lines indicates a separation process in which a possible compound of several semiconductor chips 1 is separated through the housing body 2 into individual optoelectronic components 100. Accordingly, the side surfaces of the resulting housing body 2 connecting the top side 20 and the underside 22 show traces of a separation process.

The invention is not limited to the description based on the exemplary embodiments. Rather, the invention comprises each new feature as well as each combination of features, which in particular includes each combination of features in the claims, even if these features or this combination itself is not explicitly stated in the claims or exemplary embodiments.

Aspect 1 includes an optoelectronic component (100) including an optoelectronic semiconductor chip (1) having an emission side (10) and a rear side (12) opposite the emission side, a housing body (2) having a top side (20) and an underside (22) opposite the top side (20), a metal layer (3) on the top side (20) of the housing body (2), wherein the semiconductor chip (1) emits primary electromagnetic radiation via the emission side (10) during normal operation, the semiconductor chip (1) is embedded in the housing body (2) and is laterally surrounded by the housing body (2), the emission side (10) is arranged downstream of the rear side (12) and the top side (20) is arranged downstream of the underside (22) along a main emission direction (4) of the semiconductor chip (1), the metal layer (3) is at least partially reflecting or absorbing radiation generated by the optoelectronic component (100).

Aspect 2 includes the optoelectronic component (100) according to aspect 1, wherein the metal layer (3) is offset in the lateral direction by at most 200 μm with respect to the emission side (10), and the metal layer (3) has a thickness between 0.5 μm and 50 μm inclusive.

Aspect 3 includes the optoelectronic component (100) according to aspect 1 or 2, wherein in top view of the emission side (10) the semiconductor chip (1) is completely surrounded laterally by the metal layer (3).

Aspect 4 includes the optoelectronic component (100) according to one of the preceding aspects, wherein the metal layer (3) is reflective for the radiation generated by the optoelectronic component (100) or has a reflective partial layer (31) facing the top side (20).

Aspect 5 includes the optoelectronic component (100) according to one of the preceding aspects, wherein a non-metallic coating (5) is applied to a side of the metal layer (3) remote from the top side (20) of the housing body (2).

Aspect 6 includes the optoelectronic component (100) according to one of the preceding aspects, wherein at least a first section (23) of the top side (20) of the housing body (2) is arranged downstream of the emission side (10) in the main emission direction (4) or is at the same level as the emission side (10).

Aspect 7 includes the optoelectronic component (100) according to aspect 6, wherein on the emission side (10) of the semiconductor chip (1) a conversion element (6) is arranged, which comprises an exit side (60) facing away from the semiconductor chip (1), and the first section (23) of the top side (20) is offset along the main emission direction (4) by at most 100 μm with respect to the exit side (60) of the conversion element (6).

Aspect 8 includes the optoelectronic component (100) according to one of the preceding aspects, wherein the top side (20) of the housing body (2) comprises at least one second section (24) in which the top side (20) extends substantially parallel to the emission side (10) of the semiconductor chip (1), and the metal layer (3) covers the top side (20) at least in the second section (24).

Aspect 9 includes the optoelectronic component (100) according to one of the preceding aspects, wherein the top side (20) of the housing body (2) is flat within the manufacturing tolerance.

Aspect 10 includes the optoelectronic component (100) according to one of the preceding aspects, wherein the top side (20) comprises a third section (25) which is transverse or perpendicular to the emission side (10), and the third section (25) is covered with the metal layer (3).

Aspect 11 includes the optoelectronic component (100) according to at least aspects 8 and 10, wherein the third section (25) is connected to the second section (24) by an edge (26), and said second section (24) is arranged downstream of said third section (24) along a lateral direction away from said semiconductor chip (1).

Aspect 12 includes the optoelectronic component (100) according to at least one of aspects 1 to 7, wherein the top side (20) of the housing body (2) is provided with a trench (27), and the top side (20) of the housing body (2) is covered with the metal layer (3) in the region of the trench (27).

Aspect 13 includes the optoelectronic component (100) according to one of the preceding aspects, wherein an identifying feature (33) is introduced into the metal layer (3), which can be read by the naked eye or a camera.

Aspect 14 includes method for producing optoelectronic components, including the steps: A) providing a compound of several optoelectronic semiconductor chips which are embedded in a housing body (2), which is formed in one piece and are laterally surrounded by the housing body (2), wherein the semiconductor chips each comprise an emission side (10) and a rear side (12) opposite the emission side (10), the semiconductor chips emit primary electromagnetic radiation via the emission side (10) during normal operation, the housing body (2) comprises a top side (20) and an underside (22) opposite the top side (20), the emission side (10) in each case is arranged downstream of the rear side (12) and the top side (20) is arranged downstream of the underside (22) along a main emission direction (4) of the semiconductor chip (1), on the emission side of the semiconductor chips in each case a conversion element is arranged, which comprises an exit side facing away from the semiconductor chip, and the conversion element is completely surrounded laterally by the housing body in each case, B) depositing a metal layer (3) on the top side (20) of the housing body (2), wherein the metal layer (3) is applied by using a mask (7) such that, in a top view of the emission side, the metal layer does not cover any region of the emission side, C) separating the optoelectronic components by cutting the compound through the housing body.

Aspect 15 includes the method according to aspect 14, wherein an identifying feature (33) is produced in the metal layer (3) by means of the mask (7), wherein the identifying feature (33) can be read by means of the naked eye or a camera.

Aspect 16 includes the method according to aspect 14, wherein after the deposition of the metal layer (3) an identifying feature (33) is written into the metal layer (3).

Aspect 17 includes the method according to one of the preceding aspects, wherein the top side (20) of the housing body (2) comprises an edge (26) or a trench (27), in step B) the metal layer (3) is deposited in the region of the edge (26) or the trench (27).

Aspect 18 includes an optoelectronic component including an optoelectronic semiconductor chip having an emission side and a rear side opposite the emission side, a housing body, which is formed in one piece and has a top side and an underside opposite the top side, a metal layer on the top side of the housing body, wherein the semiconductor chip emits primary electromagnetic radiation via the emission side during normal operation, the semiconductor chip is embedded in the housing body and is laterally surrounded by the housing body, the emission side is arranged downstream of the rear side and the top side is arranged downstream of the underside along a main emission direction of the semiconductor chip, the metal layer is at least partially reflecting or absorbing radiation generated by the optoelectronic component, the housing body has side surfaces that are transverse or perpendicular to the emission side, wherein the side surfaces show traces of a separation process, in a top view of the emission side, the metal layer does not cover any region of the emission side, on the emission side of the semiconductor chip a conversion element is arranged, which comprises an exit side facing away from the semiconductor chip, and the conversion element is completely surrounded laterally by the housing body.

LIST OF REFERENCE SIGNS 1 optoelectronic semiconductor chip
2 housing body
3 metal layer
4 main emission direction
5 non-metallic coating
6 conversion element
7 mask
10 emission side
12 rear side
20 top side of the housing body 2
22 underside of the housing body 2
23 first section of the top side 20
24 second section of the top side 20
25 third section of the top side 20
26 edge
27 trench
31 partial layer of the metal layer 3
60 exit side of the conversion element 6
100 optoelectronic component

The invention claimed is:

1. An optoelectronic component comprising:
an optoelectronic semiconductor chip having an emission side and a rear side opposite the emission side;
a housing body having a top side and an underside opposite the top side;
a metal layer on the top side of the housing body;
wherein
the semiconductor chip emits primary electromagnetic radiation via the emission side during normal operation,
the semiconductor chip is embedded in the housing body and is laterally surrounded by the housing body,
the emission side is arranged downstream of the rear side and the top side is arranged downstream of the underside along a main emission direction of the semiconductor chip,
the metal layer is at least partially reflecting or absorbing radiation generated by the optoelectronic component, and
further comprising:
a non-metallic coating is applied to a side of the metal layer remote from the top side of the housing body,
the top side of the housing body is provided with a trench and the top side of the housing body is covered with the metal layer in the region of the trench, or
an identifying feature is introduced into the metal layer, which can be read by the naked eye or a camera.

2. The optoelectronic component according to claim 1, wherein
the metal layer is offset in the lateral direction by at most 200 μm with respect to the emission side,
the metal layer has a thickness between 0.5 μm and 50 μm inclusive.

3. The optoelectronic component according to claim 1, wherein
in top view of the emission side the semiconductor chip is completely surrounded laterally by the metal layer.

4. The optoelectronic component according to claim 1, wherein
the metal layer is reflective for the radiation generated by the optoelectronic component.

5. The optoelectronic component according to claim 1, wherein, based on the non-metallic coating being applied to the side of the metal layer remote from the top side of the housing body or the identifying feature being introduced into the metal layer:
the top side of the housing body comprises at least one second section in which the top side extends substantially parallel to the emission side of the semiconductor chip,
the metal layer covers the top side at least in the second section.

6. The optoelectronic component according to claim 1, wherein, based on the non-metallic coating being applied to the side of the metal layer remote from the top side of the housing body or the identifying feature being introduced into the metal layer, the top side of the housing body includes a section that is flat within the manufacturing tolerance.

7. The optoelectronic component according to claim 1, wherein, based on the non-metallic coating being applied to the side of the metal layer remote from the top side of the housing body or the identifying feature being introduced into the metal layer:
at least a first section of the top side of the housing body is arranged downstream of the emission side in the main emission direction or is at the same level as the emission side.

8. The optoelectronic component according to claim 7, wherein
on the emission side of the semiconductor chip a conversion element is arranged, which comprises an exit side facing away from the semiconductor chip,
the first section of the top side is offset along the main emission direction by at most 100 μm with respect to the exit side of the conversion element.

9. The optoelectronic component according to claim 1, wherein, based on the identifying feature being introduced into the metal layer:

the top side comprises a third section which is transverse or perpendicular to the emission side, the third section is covered with the metal layer.

10. The optoelectronic component according to claim 9, wherein the third section is connected to a second section by an edge, said second section is arranged downstream of said third section along a lateral direction away from said semiconductor chip.

11. A method for producing optoelectronic components, comprising the steps:

A) providing a compound of several optoelectronic semiconductor chips which are embedded in a housing body, which is formed in one piece and are laterally surrounded by the housing body, wherein the semiconductor chips each comprise an emission side and a rear side opposite the emission side, the semiconductor chips emit primary electromagnetic radiation via the emission side during normal operation, the housing body comprises a top side and an underside opposite the top side, the emission side in each case is arranged downstream of the rear side and the top side is arranged downstream of the underside along a main emission direction of the semiconductor chip, on the emission side of the semiconductor chips in each case a conversion element is arranged, which comprises an exit side facing away from the semiconductor chip, and the conversion element is completely surrounded laterally by the housing body in each case;

B) depositing a metal layer on the top side of the housing body, wherein the metal layer is applied by using a mask such that, in a top view of the emission side, the metal layer does not cover any region of the emission side;

C) separating the optoelectronic components by cutting the compound through the housing body.

12. The method according to claim 11, wherein an identifying feature is produced in the metal layer by means of the mask, wherein the identifying feature can be read by means of the naked eye or a camera.

13. The method according to claim 11, wherein after the deposition of the metal layer an identifying feature is written into the metal layer.

14. The method according to claim 11, wherein the top side of the housing body comprises an edge or a trench, in step B) the metal layer is deposited in the region of the edge or the trench.

15. An optoelectronic component comprising:

an optoelectronic semiconductor chip having an emission side and a rear side opposite the emission side;

a housing body, which is formed in one piece and has a top side and an underside opposite the top side;

a metal layer on the top side of the housing body; wherein the semiconductor chip emits primary electromagnetic radiation via the emission side during normal operation, the semiconductor chip is embedded in the housing body and is laterally surrounded by the housing body, the emission side is arranged downstream of the rear side and the top side is arranged downstream of the underside along a main emission direction of the semiconductor chip, the metal layer is at least partially reflecting or absorbing radiation generated by the optoelectronic component, the housing body has side surfaces that are transverse or perpendicular to the emission side, in a top view of the emission side, the metal layer does not cover any region of the emission side, on the emission side of the semiconductor chip a conversion element is arranged, which comprises an exit side facing away from the semiconductor chip, and the conversion element is completely surrounded laterally by the housing body.

* * * * *